METHOD OF FORMING THE ELECTRODE OF A SEMICONDUCTOR DEVICE

Filed Feb. 25, 1970

INVENTORS

KOGO SATO, HIROSHI KATO and SHINJI OHNISHI

BY Craig, Antonelli, Stewart & Hill

ATTORNEYS

United States Patent Office 3,672,984

Patented June 27, 1972

3,672,984
METHOD OF FORMING THE ELECTRODE OF A SEMICONDUCTOR DEVICE

Kogo Sato, Kokubunji, Hiroshi Kato, Tokyo, and Shinji Ohnishi, Kokubunji, Japan, assignors to Hitachi, Ltd., Tokyo, Japan Filed Feb. 25, 1970, Ser. No. 14,116
Claims priority, application Japan, Mar. 12, 1969, 44/18,331
Int. Cl. H01i *1/14*
U.S. Cl. 117—212 7 Claims

ABSTRACT OF THE DISCLOSURE

In forming an electrode in a semiconductor device, an aluminium layer is thinly deposited on the whole surface of a film of semiconductor oxide such as silicon oxide covering a major surface of a semiconductor substrate and on a portion of the major surface exposed in a hole formed in the film, the combination thus obtained is heated so that the portion of the aluminium layer deposited in the hole is alloyed with the semiconductor and so that the portion of the aluminium layer on the film is oxidized by the reaction with the semiconductor oxide, then an electrode metal is deposited on the alloy region thus obtained. The layer of the oxidized aluminium, that is, alumina is used as a passivation film.

This invention relates to a method for forming an electrode in a semiconductor device, and more particularly to a method for forming an aluminium electrode on a semiconductor substrate.

As a method for connecting an electrode to a semiconductor substrate in a semiconductor device such as a double heat sink diode, the following method has been known. First, a portion of a passivation film of silicon oxide formed on a silicon substrate is removed to expose a portion of the substrate. A thin layer of metal such as molybdenum and nickel adhesive to silicon is stacked on the exposed surface. Finally, a layer of silver having a high conductivity is deposited to form an electrode.

However, according to this method, molybdenum, nickel and silver are liable to form oxides on their surfaces, deteriorating the forward characteristic of the electrodes. As a result, good ohmic contact cannot be obtained. In addition, the surface passivation effect of the silicon dioxide film is not satisfactory.

One object of the present invention is to provide an improved method for forming a good ohmic contact to a semiconductor substrate with an improved passivation film by the simplified manufacturing processes.

According to one embodiment of this invention, after a portion of an insulating film containing semiconductor oxide formed on one major surface of a semiconductor substrate is removed to expose a portion of the substrate surface, an aluminium layer is deposited on the surface of the insulating film and on the exposed surface of the substrate. And the substrate with the aluminium layer is then heated so that the portion in contact with the semiconductor substrate may be alloyed with the semiconductor while the portion on the insulating film is made to react with the semiconductor oxide to be converted to aluminium oxide, whereby a passivation layer is formed, and thereafter a suitable electrode metal is deposited on the alloyed region thus obtained.

The formation of a passivation layer containing alumina on the insulating film of, for example, silicon dioxide is effective in increasing the moisture-proof property of the film. In the steps of electrode formation according to this invention, the formation of the passivation film and alloying of the electrode with the semiconductor are done simultaneously, thus simplifying the steps and improving the stability of the electric characteristics of the semiconductor device.

The above and other objects and advantages of this invention will be made more apparent from the explanation of the preferred embodiment of this invention with reference to the accompanying drawings; in which FIGS. 1 to 6 show cross-sectional views of a semiconductor element in each step of forming an electrode according to this invention.

Figure 1:
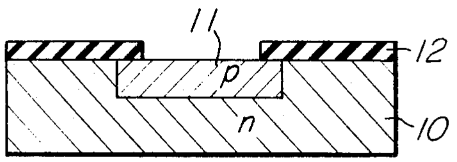

Referring to FIG. 1, a first conductivity type region, for example a P type region 11 is formed in a major surface of a second conductivity type semiconductor substrate 10 of, for example an N type crystalline silicon by diffusing a boron impurity into the substrate 10 through a hole formed in a mask layer 12 of silicon oxide $SiO_2$ which covers the major surface of the substrate 10. The silicon oxide layer 12 is formed by heating the major surface of the silicon substrate 10 in an oxidizing atmosphere such as wet oxygen or by depositing thermally decomposed silicon oxide on the major surface. The surface of the region 11 may be covered with another silicon oxide layer since the diffusion process is carried out in an oxidizing atmosphere.

Then, as shown in FIG. 1, a hole reading the P type region 11 is formed in the oxide layer by a conventional photo-engraving technique. A surface layer including phosphorous pentoxide $P_2O_5$ may be formed on the silicon oxide layer 12 before the hole is formed.

Figure 2:
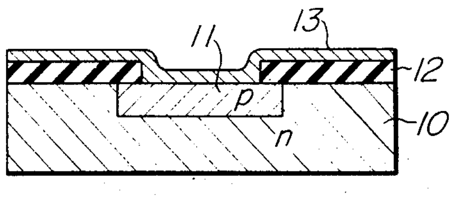

Using the conventional vacuum evaporation method, an aluminium layer 13 of 100 to 500 A. thickness is formed on the whole surfaces of the silicon oxide film 12 and of the P type diffusion region 11 exposed in the hole formed in the silicon oxide film 12, as shown in FIG. 2. Prior to the deposition of aluminium it is preferable to heat the substrate 10 up to about 200° C. to remove any gas particles remaining on the substrate surface.

Figure 3:
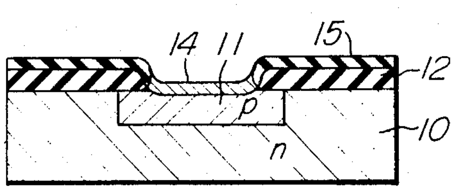

The substrate 10 is heated at a temperature of about 700 to 850° C. for at least 10 minutes for example, 30 minutes, in vacuum or in an inert gas atmosphere such as nitrogen and helium. By such a heating treatment aluminium on the silicon substrate is alloyed with silicon so that a silicon-aluminium alloy layer 14 having a eutectic temperature of 577° C. is formed. At the same time, aluminium on the silicon oxide layer 12 reacts with the oxide layer 12 to be converted to aluminium trioxide $Al_2O_3$, whereby a passivation layer 15 is formed, as shown in FIG. 3.

Figure 4:
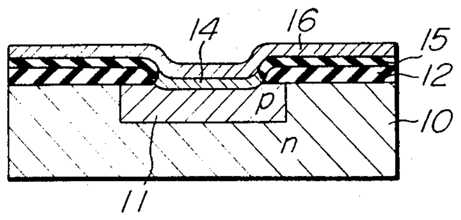

On the passivation layer 15 aluminium, or another metal such as chromium or titanium which adheres well with aluminium and aluminium trioxide $Al_2O_3$ is evaporated to form an electrode metal layer 16 of 100 to 1000 A. thickness, as shown in FIG. 4.

Figure 5:
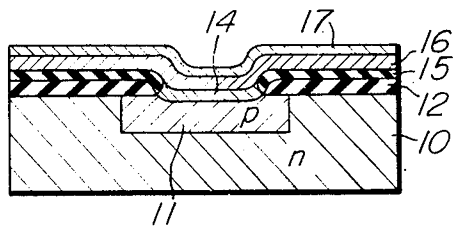

On the above electrode metal layer 16 a layer 17 having a large electric conductivity, for example, of gold or silver of about 1$\mu$ thickness is deposited, as shown in FIG. 5.

Figure 6:
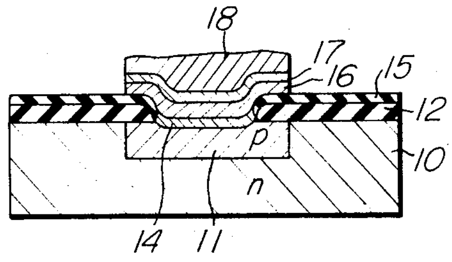

By the conventionally known photoetching technique unwanted portions of these metal layers 16 and 17 are removed, as shown in FIG. 6. With the metal layer 17 as an electrode a lead is directly bonded to it. Or as shown in FIG. 6, before the removal of the unwanted portions of the metal layers 16 and 17, solder material is applied to the silver layer 17 to form a pad layer 18 of about 5 to 20$\mu$ thickness.

When aluminium is used as the layer 13 in the above embodiment, the layers 17 and 18 may be omitted.

Although only one embodiment of this invention has been explained regarding the formation of an electrode, it is apparent that this invention may be also applied to electrode formation in transistors and integrated circuits.

What is claimed is:

1. A method of manufacturing a semiconductor device comprising the steps of forming a first insulating film including an oxide over a major surface of a semiconductor substrate; forming in the first insulating film a hole exposing a portion of the substrate; depositing a first metal layer over the entire major surface of the substrate including the exposed surface portion of the substrate and the first insulating film; converting the portion of the first metal layer on the first insulating film into an oxide of the metal by reacting the metal with said oxide in the first insulating film, by heating the combination thus obtained to a temperature higher than the eutectic temperature of the first metal and the substrate to alloy the portion of the first metal layer in the hole with the semiconductor substrate, whereby an alloy layer of the first metal layer with the semiconductor substrate and a second insulating film including the oxide of the metal are formed simultaneously in the hole and on the first insulating film, respectively, and said second insulating film remains permanently with the first insulating film on the substrate; and then forming a second metal layer connected to the alloyed layer and extending on the second insulating film.

2. A method of manufacturing a semiconductor device according to claim 1, wherein said substrate is made of silicon, said first metal layer is made of aluminium, said first insulating film includes silicon oxide, and said second metal layer is of a metal selected from the group consisting of aluminium, chromium and titanium.

3. A method of manufacturing a semiconductor device comprising the steps of: forming a hole exposing a surface portion of a silicon semiconductor substrate in an insulating film including silicon oxide and covering the major surface of the substrate; depositing aluminium to form an aluminum layer having a thickness of from 100 to 500 angstroms and covering the exposed portion of the substrate and the surface of the insulating film; and heating the combination thus obtained at a temperature of from 700 to 850° C. for at least 10 minutes to make the portion of the aluminum layer in the hole alloyed with the silicon substrate and to convert the portion of the aluminum layer on the insulating film into aluminum oxide, said aluminium oxide remaining unitary with the insulating film on the substrate.

4. A method of manufacturing a semiconductor device according to claim 3, further comprising the step of forming a layer of a metal selected from the group consisting of aluminium, chronium and titanium which contacts with the metal layer alloyed with the silicon substrate in said hole.

5. A semiconductor device comprising:

(a) a semiconductor substrate having a major surface;

(b) a first insulating film containing oxide which is formed on said major surface and has a hole therein to expose a portion of said major surface;

(c) a first metal layer alloyed with the whole of the said exposed portion;

(d) a second insulating film formed on the surface of said first insulating film, containing an oxide of said first metal and being adjacent to said first metal layer; and (e) a second metal layer formed on said first metal layer and extending to said second insulating film.

6. A semiconductor device according to claim 5, wherein said semiconductor substrate is of silicon, said first insulating film contains silicon oxide, said first metal layer is of aluminium, and said second metal layer is of a metal selected from the group of aluminium, chronium and titanium.

7. A semiconductor device according to claim 6, wherein a third metal layer of at least one of gold and silver is formed on said second metal layer.

References Cited

UNITED STATES PATENTS

| | | | |
|---|---|---|---|
| 3,237,271 | 3/1966 | Arnold et al. | 117—212 X |
| 3,386,894 | 6/1968 | Steppat | 117—212 X |
| 3,290,570 | 12/1966 | Cunningham et al. | 117—212 |
| 3,502,950 | 3/1970 | Nigh et al. | 117—200 X |
| 3,413,157 | 12/1968 | Kuiper | 148—171 |

RALPH S. KENDALL, Primary Examiner

U.S. Cl. X.R.

117—217